United States Patent [19]

Coyne

[11] 4,454,566
[45] Jun. 12, 1984

[54] HEAT REMOVAL FROM CABINETS HOUSING ELECTRONIC EQUIPMENT

[75] Inventor: James C. Coyne, New Providence, N.J.

[73] Assignee: Bell Telephone Laboratories, Incorporated, Murray Hill, N.J.

[21] Appl. No.: 325,329

[22] Filed: Nov. 27, 1981

[51] Int. Cl.³ .............................................. H05K 7/20
[52] U.S. Cl. ..................................... 361/386; 361/415
[58] Field of Search .................. 165/185, 80 A, 80 B, 165/80 C; 361/381–383, 386, 388, 389, 391, 393–395, 399, 415

[56] References Cited

U.S. PATENT DOCUMENTS

| | | | |
|---|---|---|---|
| 3,212,568 | 10/1965 | Frawley | 361/386 |
| 3,313,340 | 4/1967 | Dubin | 165/80 B |
| 3,364,395 | 1/1968 | Donofrio | 361/386 |
| 3,997,819 | 12/1976 | Eggert | 361/386 |
| 4,193,444 | 3/1980 | Boyd | 361/388 |
| 4,203,147 | 5/1980 | Gabr | 361/386 |

*Primary Examiner*—G. P. Tolin
*Attorney, Agent, or Firm*—Robert O. Nimtz; Stephen M. Gurey; John K. Mullarney

[57] ABSTRACT

Heat generated from electronic equipment packed densely on a circuit board is transferred to conductive partition plates located adjacent to and on opposite sides of the circuit board. Heat is then transferred from the partition plates to conductive shelves located above and below the partition plates and then to a conductive rear wall of a cabinet. Heat is then transferred through the rear wall to a plurality of external fins and then to the atmosphere by radiation and convection. Alternatively, the circuit boards are housed in sealed enclosures. A clamp, fastened to the rear wall of the cabinet, is used for securing the sealed enclosure and for transferring the heat from the electronic equipment to the rear wall.

1 Claim, 7 Drawing Figures

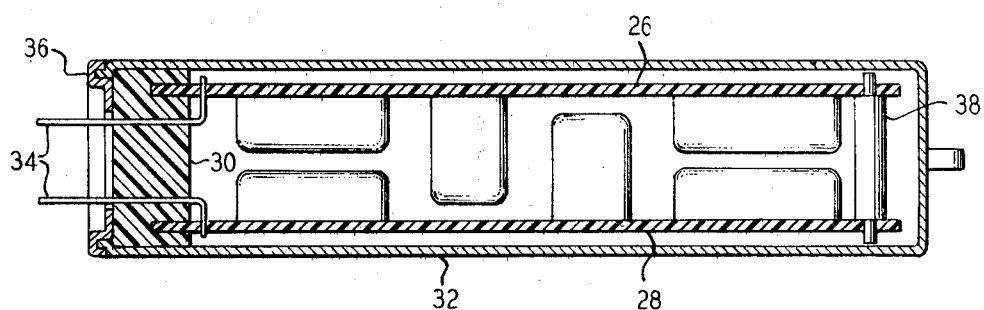
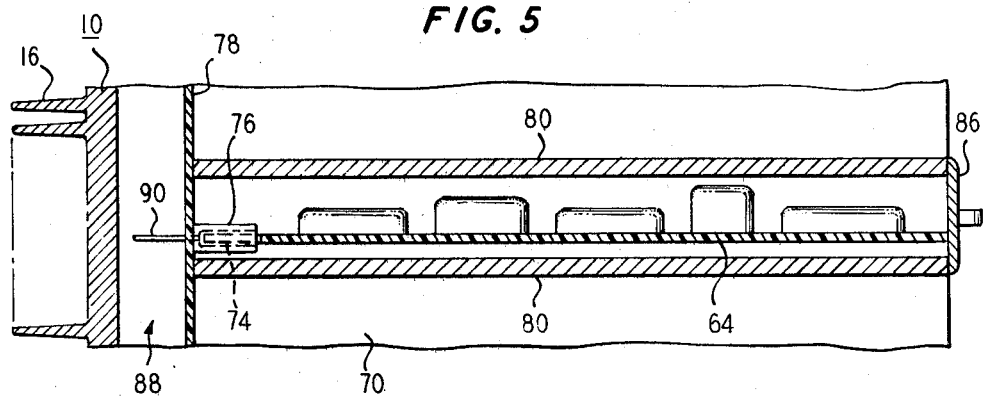
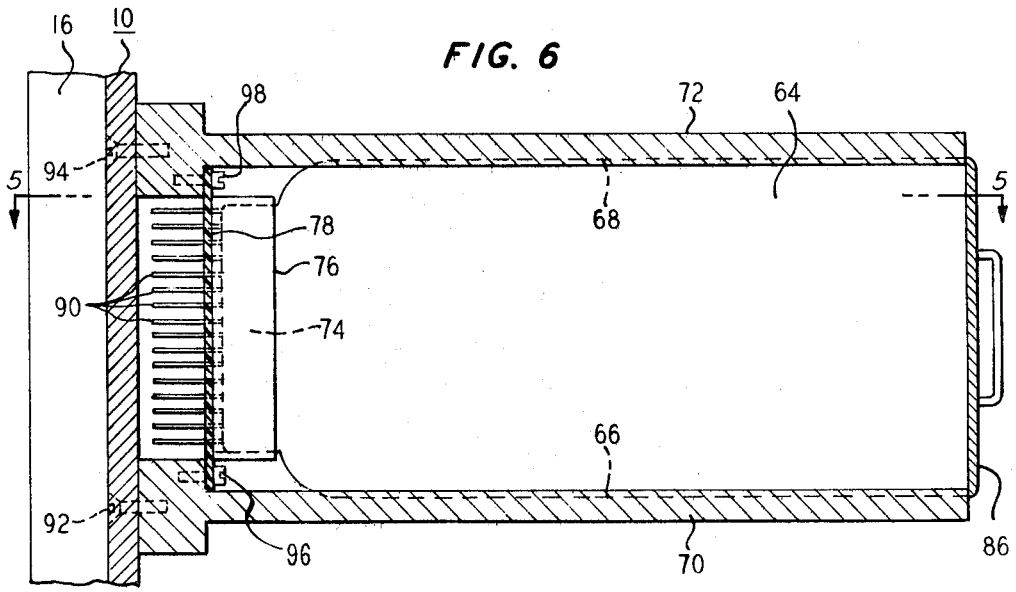

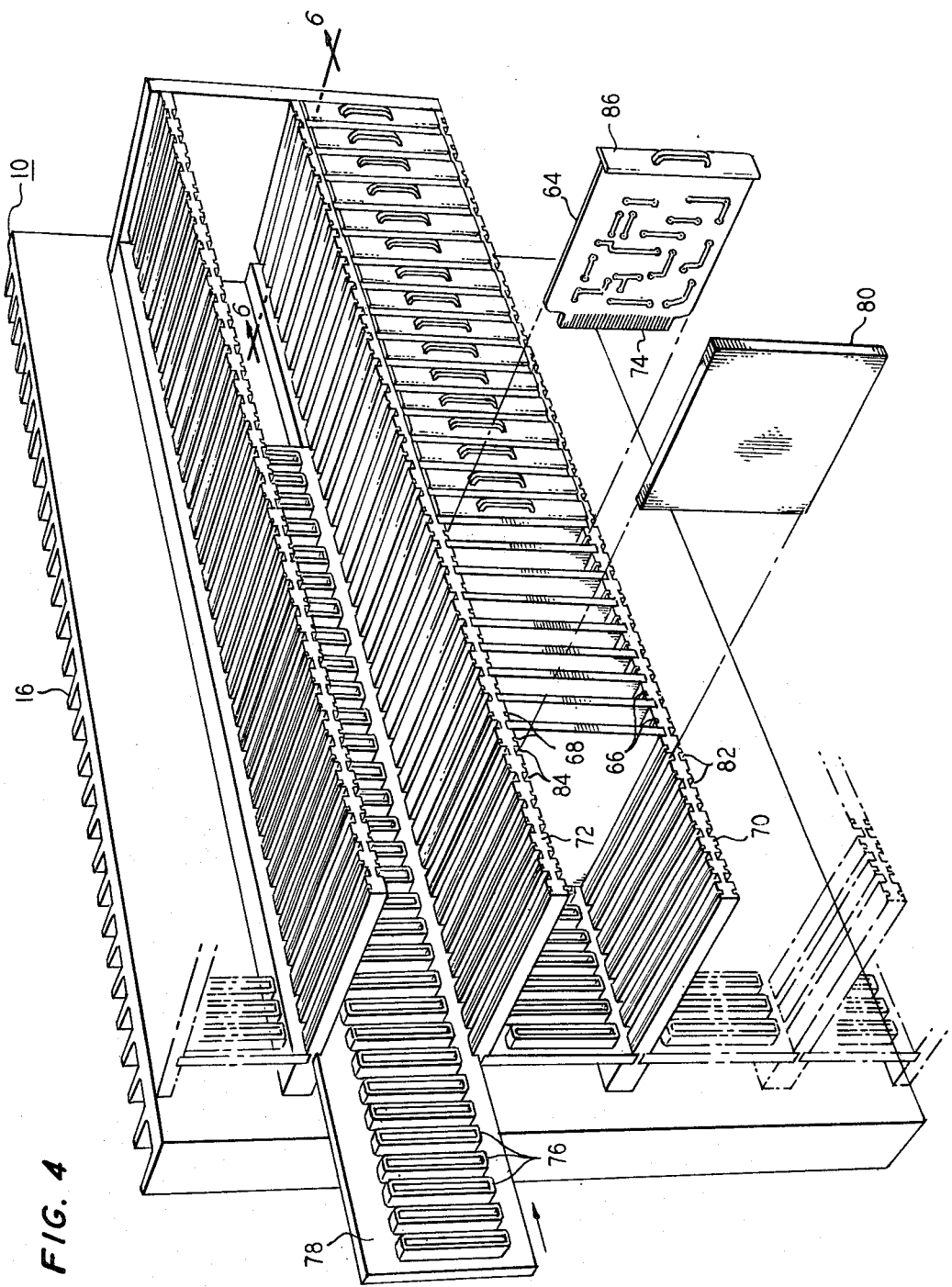

HEAT REMOVAL FROM CABINETS HOUSING ELECTRONIC EQUIPMENT

TECHNICAL FIELD

This invention relates to heat removal from cabinets and, in particular, to heat removal from cabinets housing electronic equipment for transmission systems.

BACKGROUND OF THE INVENTION

In telecommunications transmission systems, there is a need for housing electronic equipment at locations between telephone central offices. The aforesaid electronic equipment may be located in manholes below ground level or in cabinets above ground level. To protect the electronic equipment from rain, dust, and physical abuse, the cabinets, when used, must be substantially closed.

Heat generated from the electronic equipment is transferred primarily by convection air current within the closed cabinet to the metallic walls thereof and then by radiation and convection to the atmosphere. For effective heat transfer by convection, large spaces must be provided for air flow between circuit boards and between the inside cabinet surfaces and the equipment on the aforesaid circuit boards.

Solar energy, incident on the cabinet walls, is conducted therethrough, raising the temperature within the cabinet.

In order to prevent failure of the aforesaid electronic components, it is necessary to maintain the temperature within the cabinet below a certain level. This objective may be achieved using known methods by air conditioning, increasing the size of the cabinet, reducing the density of the electronic equipment mounted on circuit boards, or a combination thereof. Such methods, however, increase the cost of telecommunications services.

It is desirable to use compact cabinets housing circuit boards densely packed with electronic equipment and yet maintain the temperature within the cabinet below an acceptable level.

SUMMARY OF THE INVENTION

In accordance with an illustrative embodiment of the present invention the aforesaid objective of maintaining the temperature within a cabinet housing densely packed electronic equipment below an acceptable level is achieved by transferring heat generated from the electronic equipment to the cabinet walls primarily by conduction and radiation.

Partition plates having high thermal conductivity are located adjacent to and on opposite sides of a circuit board having electronic equipment densely packed thereon. The partition plates are located as near to the circuit board as possible, thereby increasing the packing density. Heat generated from the electronic equipment is transferred to the partition plates by radiation and conduction through the air therebetween.

Heat collected by the partition plates is transferred by conduction to shelves for supporting the partition plates and the circuit boards. The shelves being fabricated from a material having high thermal conductivity facilitates the transfer of heat by conduction therefrom to the backwall of the cabinet, from which the shelves are supported. Additionally, heat may also be transferred from the shelves to the sidewalls of the cabinet.

The cabinet's backwall, and sidewalls when used for heat transfer, is fabricated from a material having a high thermal conductivity. Heat is transferred by conduction through the wall to a plurality of fins, also fabricated from material having high thermal conductivity, located on the exterior surface thereof. Heat is then transferred from the fins to the atmosphere by radiation and convection.

In a different embodiment of the present invention for use below ground, each of the aforesaid circuit boards is enclosed in a sealed package. Alternatively, two circuit boards may be sealed in a package. Spaces between the circuit boards and the package are filled with a dessicant and an encapsulant. Each sealed package is firmly held by a clamp fastened to the backwall of the cabinet. Heat is transferred by conduction or radiated from the electronic equipment through the walls of the sealed package and conducted through the package walls to the clamp, fabricated from a material having high thermal conductivity. Heat is then transferred from the clamp through the backplate, through a plurality of fins affixed to the external surface of the backplate, to the atmosphere.

An advantage of the present invention resides in the high packing density of circuit boards in cabinets without substantially increasing the temperature therein.

BRIEF DESCRIPTION OF THE DRAWINGS

FIG. 3 shows a sectional view of an enclosed package comprising one or more circuit boards with electronic equipment mounted thereon;

FIG. 4 shows a plurality of shelves with partition plates between circuit boards for removing heat therefrom;

FIG. 5 shows a plan view of a circuit board of FIG. 4;

FIG. 6 shows an elevation view of the circuit board of FIG. 5; and

DETAILED DESCRIPTION

Figure 1:
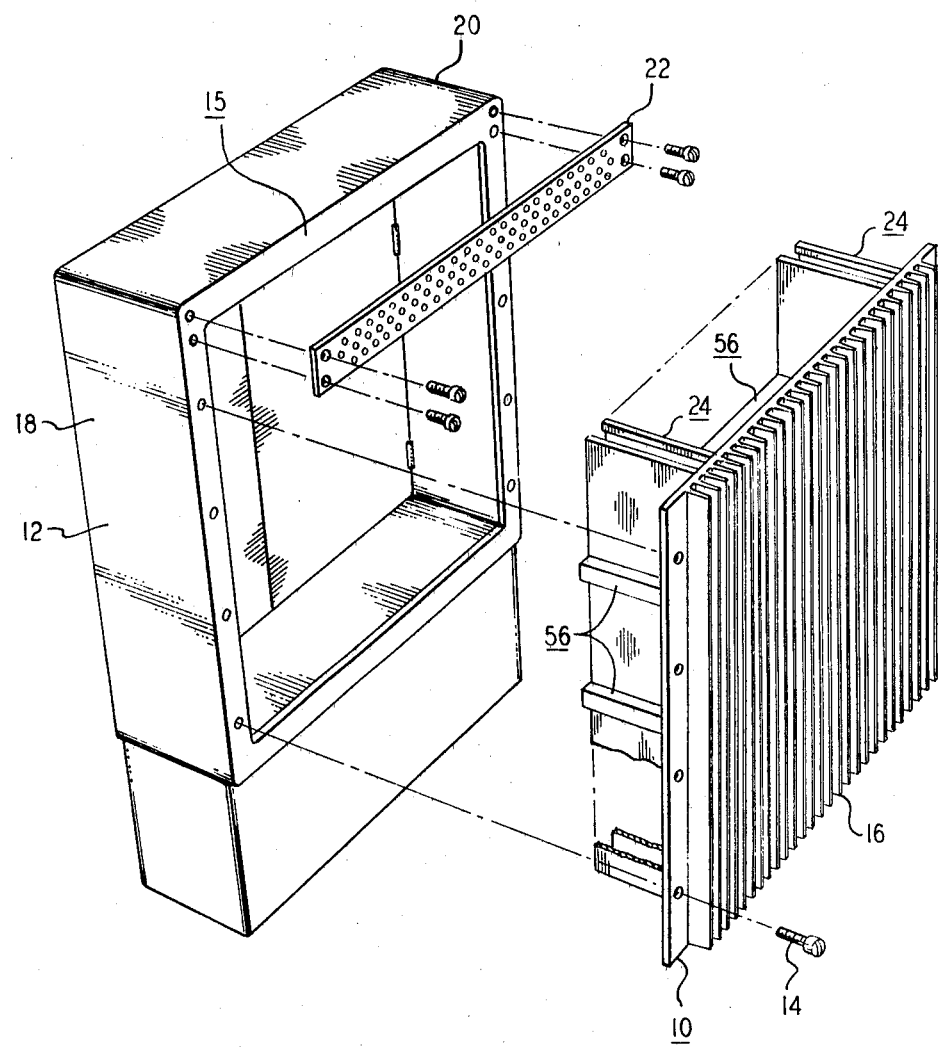
FIG. 1 shows a cabinet for housing electronic equipment and for transferring heat therefrom to the atmosphere.

Referring to FIG. 1, there is shown in isometric view a cabinet for housing electronic equipment and for transferring heat generated from the electronic equipment to the atmosphere. The rear wall 10 of the cabinet is fastened to the frame 15 by a plurality of screws 14. Alternatively, the rear wall 10 may be welded to the frame 15 of the cabinet.

The exterior surface of rear wall 10 of the cabinet comprises a plurality of fins 16. The fins 16 may be an integral part of the rear wall 10. Alternatively, the fins 16 may be an integral part of a plate which will be mounted on a backplate (not shown) to form the rear wall 10. Because of the large exterior surface area of the fins, solar energy incident on the cabinet will be transferred by radiation and convection to the atmosphere at a faster rate than if the rear wall were flat. For the same reason, heat generated from electronic equipment and transferred to the rear wall, to be described more fully hereinbelow, will be removed from the cabinet and transferred to the atmosphere at a faster rate through the finned surface 16 than a flat surface.

Where an unusually large quantity of heat is expected to be generated within the cabinet, the sides 18 and 20 thereof may also be finned.

A plurality of clamps 24 are mounted on the inner surface of the rear wall 10. The clamps 24 are located adjacent to each other and in rows. The clamps 24, rear wall 10 and fins 16 are fabricated from a material having high thermal conductivity.

Figure 2:
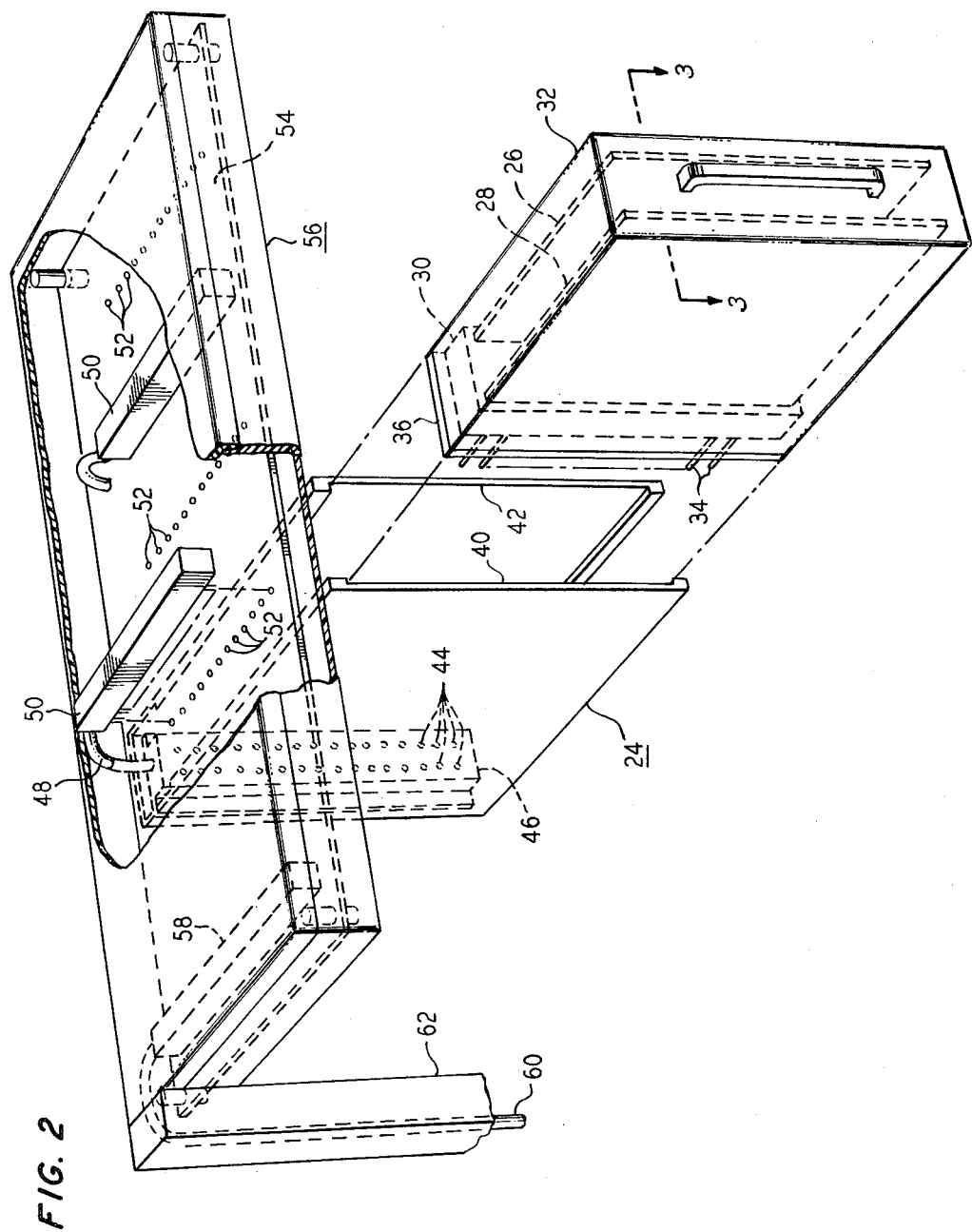
FIG. 2 shows a clamp for housing an enclosed package comprising one or more circuit boards with electronic equipment mounted thereon.

Referring to FIG. 2, there are shown details of the arrangement of the clamps 24 of FIG. 1. A plurality of clamps 24 are arranged adjacent to one another, in a row thereof.

Two circuit boards 26 and 28, each having electronic equipment densely packed thereon, are attached firmly to a pin connector 30 and sealed within container 32, fabricated from a material which functions as a good moisture barrier such as a high density polyethylene. A plurality of pins 34 project from the connector 30. A faceplate having a rim 36 is fastened to the container 32 at the connector pin end thereof.

Because the aforesaid circuit boards 26 and 28 are sealed in a container, the electronic components mounted on the aforesaid circuit boards are protected from dust, moisture, and the like. Consequently, a portion of rear wall 10, of the cabinet in FIG. 1, may be replaced by a perforated strip 22, shown therein. Such a perforated strip facilitates added heat transfer by convection, i.e., by venting.

Referring briefly to FIG. 3, there is shown the sectional view 3—3 through the sealed container 32 of FIG. 2. The circuit boards 26 and 28 are arranged so that the electronic components mounted thereon face one another and interleave with one another, thereby increasing packing density. At one end of the container 32, there is a spacer 38 for securing the circuit boards 26 and 28. At the other end of the container 32, the circuit boards 26 and 28 are secured to the connector 30 and to connector pins 34.

Referring again to FIG. 2, the sealed container 32 is inserted through the recesses 40 and 42 of the inner surfaces of clamp 24. The connector pins 34 engage with the receptacles 44 in the socket connector 46, attached firmly to the back of the clamp 24. A cable 48 from the socket connector 46 connects with a connector 50 located directly above the clamp 24. A plurality of pins extending from connector 50 engages with a plurality of holes 52 in a printed wiring interconnect circuit board 54.

The interconnect circuit board 54 is enclosed within a shelf 56 attached firmly to the rear wall 10. The wiring from each hole 52 makes electrical connection with a connector 58. A cable 60 passing through a trough 62, connects connector 58 with similar connectors (not shown) in other shelves (not shown) and then to the telecommunications transmission system (not shown).

Heat generated from the electronic components on circuit boards 26 and 28 is transferred to the clamps 24. Heat is transferred by conduction from the clamps 24 to the rear wall 10 and then through wall 10 to the fins 16. From fins 16, heat is transferred to the atmosphere by radiation and convection air currents.

In accordance with another embodiment of the present invention shown on FIG. 4, a circuit board 64 is inserted through grooves 66 and 68 of shelves 70 and 72, respectively. Shelves 70 and 72 are securely fastened to the rear wall 10. Connector pins 74 engage with a connector 76 embedded in a backplane 78.

Partition plates 80 are inserted between grooves 82 and 84 in shelves 70 and 72, respectively. Grooves 66 and 68 are offset so that when the circuit board 64 is inserted therein, the printed wiring side of the circuit board is in close proximity to the partition plate adjacent thereto and the highest component on the other side of the circuit board is in close proximity to another partition plate adjacent thereto. Circuit board 64 has a faceplate 86 so that when circuit board 64 is completely inserted in grooves 66 and 68, there is formed an enclosed space.

The partition plates 80, the shelves 70 and 72, the rear wall 10, and fins 16 are fabricated from a material having high thermal conductivity. Thus, heat generated from the electronic components mounted on the circuit board 64 is transferred by radiation and by conduction, through air, to the partition plates 80 located on both sides of and adjacent to the circuit board 64. Heat collected by the partition plates 80 is transferred by conduction through the shelves 70 and 72 and through the rear wall 10 to the fins 16. Heat is then transferred from the fins 16 to the atmosphere by radiation and by convection.

Referring to FIG. 5, there is shown a plan view of a path of FIG. 4. There is shown a circuit board 64 with electronic components mounted densely thereon having its pins 74 inserted into the receptacle of connector 76, mounted on the backplane 78. Adjacent to and on each side of the circuit board 64 are the partition plates 80. There is shown a space 88 between the backplane 78 and the rear wall 10 for a plurality of pins 90 extending from the connector 76.

Referring to FIG. 6, there is shown an elevation view 6—6 of the circuit board 64 in the assembled state in FIG. 4. There are shown screws 92 and 94 for fastening the shelves 70 and 72, respectively, to the rear wall 10. Shown also are screws 96 and 98 for fastening the backplane 78 to the shelves 70 and 72, respectively.

Figure 7:
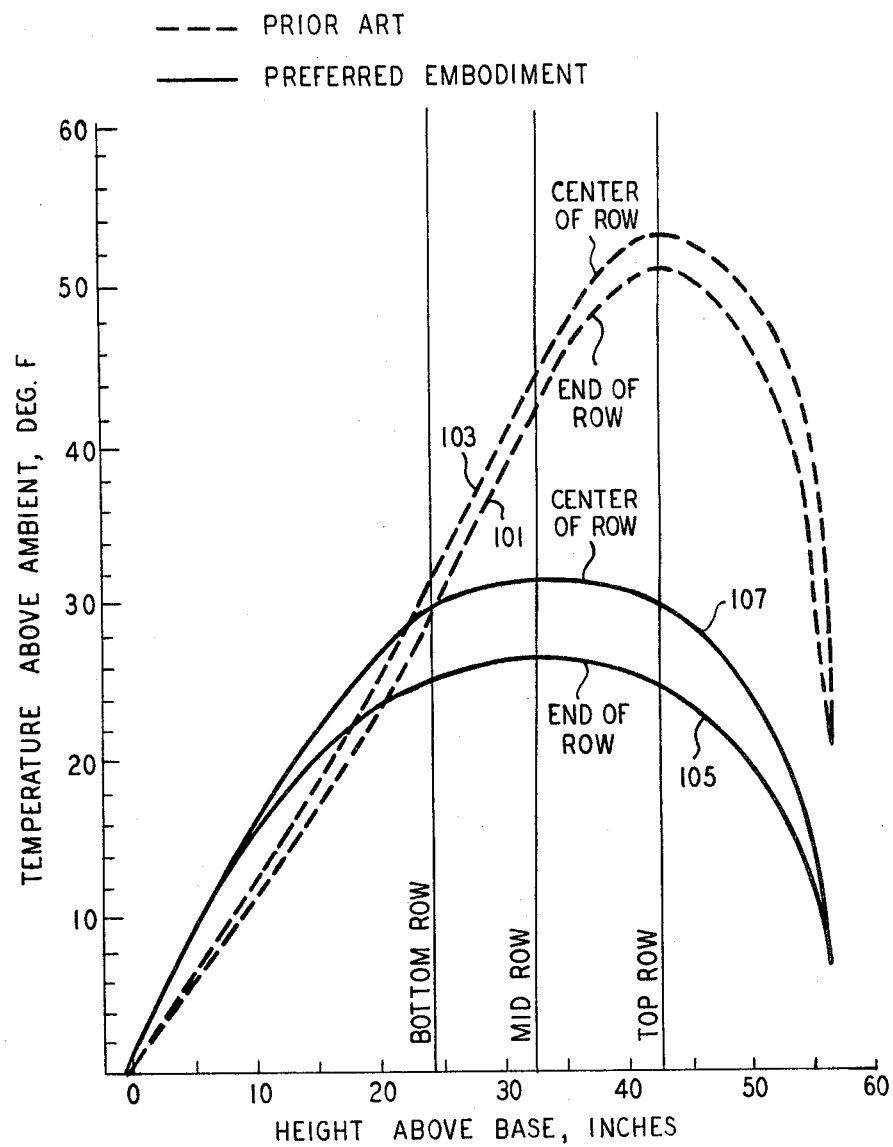
FIG. 7 shows a graphical representation of the temperature profile with a cabinet of the present invention as compared that of a prior art cabinet.

Referring to FIG. 7, there are shown temperature gradients 101 and 103 measured at the end of a row and at the center of a row, respectively, at varying heights within a prior art cabinet (not shown). Corresponding temperature gradients 105 and 107 for the cabinet embodying the present invention show substantial reduction of temperature within the cabinets.

What is claimed is:

1. An apparatus comprising a cabinet enclosing heat generating, densely packed electrical circuit elements disposed on a plurality of circuit boards, each of said circuit boards having along one edge thereof a faceplate and along the opposite edge a plurality of connector pins, said cabinet comprising a thermally conductive rear wall having on an exterior side a plurality of heat dissipating fins, a plurality of thermally conductive parallel shelves fastened in parallel to the interior side of said rear wall, said shelves comprising a plurality of grooves extending the width of said shelves, at least one backplane member affixed in parallel to said rear wall between two adjacent shelves, said backplane member comprising a plurality of connectors, a plurality of thermally conductive partition plates disposed in alternate ones of said grooves between said two adjacent shelves and extending the width of said shelves from said backplane member to the front edges of said shelves and from the under surface of one of said adjacent shelves to the upper surface of the other of said adjacent shelves, said partition plates, said backplane member and said adjacent pair of shelves forming a plurality of interstitial spaces between said partition plates, each space comprising a groove in the upper surface and in the under surface of said adjacent pair of shelves which receives one of said circuit boards, one of said connectors on said backplane member mating with the connector pins of said inserted circuit board, the faceplate of said inserted circuit board forming an enclosed space, each circuit board being disposed between a pair of thermally conductive partition plates with the grooves that receive each circuit board being offset with respect to adjacent partition plate grooves so that each circuit board groove is closer to one partition plate groove immediately adjacent thereto than to the other partition plate groove immediately adjacent thereto.

* * * * *